US008071420B2

(12) United States Patent
Su et al.

(10) Patent No.: US 8,071,420 B2
(45) Date of Patent: Dec. 6, 2011

(54) EDGE FILM REMOVAL PROCESS FOR THIN FILM SOLAR CELL APPLICATIONS

(75) Inventors: Tzay-Fa Su, San Jose, CA (US); David Morishige, Los Gatos, CA (US); Todd Martin, Mountain View, CA (US); Uday Mahajan, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

(21) Appl. No.: 12/637,214

(22) Filed: Dec. 14, 2009

(65) Prior Publication Data
US 2010/0159634 A1    Jun. 24, 2010

Related U.S. Application Data

(60) Provisional application No. 61/139,409, filed on Dec. 19, 2008.

(51) Int. Cl.
*H01L 21/268* (2006.01)
*H01L 31/18* (2006.01)
(52) U.S. Cl. ..... 438/96; 438/57; 438/795; 257/E21.347; 257/E31.126; 257/E31.04
(58) Field of Classification Search ............ 438/96, 438/57, 795; 136/256; 257/E31.04, E31.126, 257/E21.342
See application file for complete search history.

(56) References Cited

U.S. PATENT DOCUMENTS

| | | | |
|---|---|---|---|
| 4,419,530 A | 12/1983 | Nath | |
| 4,667,058 A | 5/1987 | Catalano et al. | |
| 5,217,921 A | 6/1993 | Kaido et al. | |
| 5,254,179 A | 10/1993 | Ricaud et al. | |
| 6,288,323 B1 | 9/2001 | Hayashi et al. | |
| 6,300,556 B1 | 10/2001 | Yamagishi et al. | |
| 6,324,195 B1 | 11/2001 | Suzuki et al. | |
| 6,380,478 B1 | 4/2002 | Yamamoto et al. | |
| 6,384,315 B1 | 5/2002 | Yamagishi et al. | |
| 6,653,550 B2 | 11/2003 | Hayashi et al. | |
| 6,664,169 B1 | 12/2003 | Iwasaki et al. | |
| 6,858,461 B2 | 2/2005 | Oswald et al. | |
| 7,098,395 B2 | 8/2006 | Hiraishi et al. | |
| 2005/0272175 A1 | 12/2005 | Meier et al. | |
| 2007/0181175 A1 | 8/2007 | Landis | |
| 2007/0183066 A1* | 8/2007 | Varaprasad et al. | 359/844 |
| 2008/0105295 A1 | 5/2008 | Manz | |
| 2008/0105303 A1 | 5/2008 | Oswald et al. | |

(Continued)

OTHER PUBLICATIONS

PCT international search report and written opinion of PCT/US2009/067878 dated Jun. 25, 2010.
Hideki Yoshioka, et al, "Non Hot-Spot PV Module Using Solar Cells with Bypass Diode Function," 25th PVSC, May 13-17, 1996.

(Continued)

*Primary Examiner* — Angel Roman
(74) *Attorney, Agent, or Firm* — Patterson & Sheridan, L.L.P.

(57) ABSTRACT

The present invention provides a method and apparatus for edge film stack removal process for fabricating photovoltaic devices. In one embodiment, a method for manufacturing solar cell devices on a substrate includes providing a substrate into a chemical vapor deposition chamber, contacting a shadow frame disposed in the deposition chamber to a periphery region of the substrate, depositing a silicon-containing layer on the substrate through an aperture defined by the shadow frame, transferring the substrate to a physical vapor deposition chamber, depositing a transparent conductive layer on the silicon-containing layer, transferring the substrate to a laser edge removal tool, and laser scribing the layers formed on the periphery region of the substrate.

19 Claims, 6 Drawing Sheets

U.S. PATENT DOCUMENTS

2008/0289687 A1 11/2008 Won et al.
2009/0272434 A1* 11/2009 Tachibana ............... 136/256

OTHER PUBLICATIONS

A. Kaminski, et al, "Application of Infrared Thermography to the Characterization of Multicristalline Silicon Solar Cells," date unknown.

J. Bauer, et al., "Hot Spots in MUlticrystalline Silicon Solar Cells: Avalanche Breakdown due to Etch Pits," Phys. Status Solidi RRL 3, No. 2, 40-42, 2009.

W. Hermann, et al, "Hot Spot Investigation on PV Modules—New Concepts for a Test Standard and Consequences for Module Design With Respect to Bypass Diodes," date unknown.

* cited by examiner

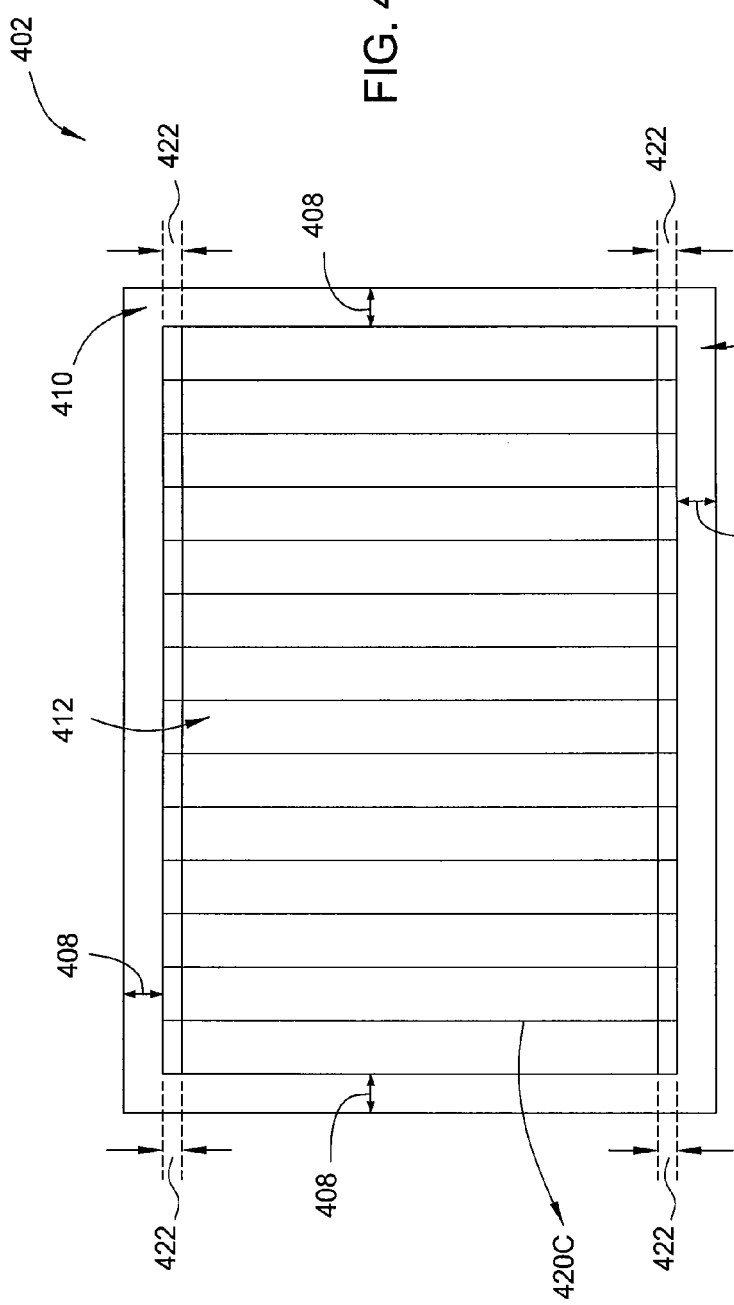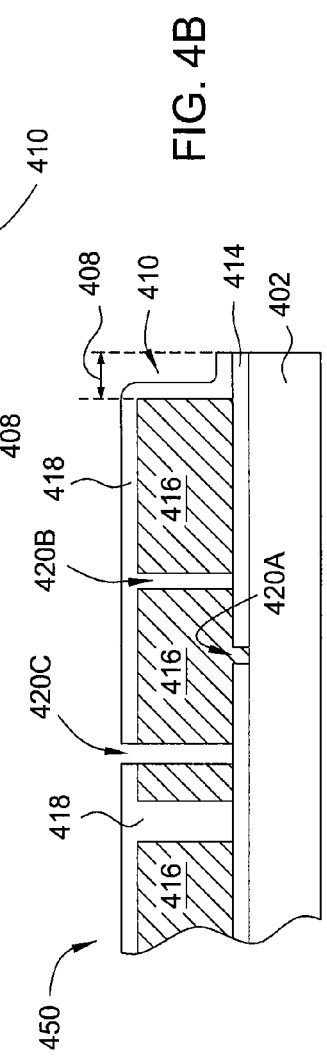

US 8,071,420 B2

EDGE FILM REMOVAL PROCESS FOR THIN FILM SOLAR CELL APPLICATIONS

CROSS-REFERENCE TO RELATED APPLICATIONS

This application claims benefit of U.S. Provisional Application Ser. No. 61/139,409 filed Dec. 19, 2008, which is incorporated by reference in its entirety.

BACKGROUND OF THE DISCLOSURE

1. Field of the Invention

The present invention relates to methods and apparatus for an edge film removal process, more particularly, for an edge film removal process for fabricating photovoltaic devices.

2. Description of the Background Art

Photovoltaic (PV) devices or solar cells are devices which convert sunlight into direct current (DC) electrical power. PV or solar cells typically have one or more p-i-n junctions. Each junction comprises two different regions within a semiconductor material where one side is denoted as the p-type region and the other as the n-type region. When the p-i-n junction of the PV cell is exposed to sunlight (consisting of energy from photons), the sunlight is directly converted to electricity through a PV effect. PV solar cells generate a specific amount of electric power and cells are tiled into modules sized to deliver the desired amount of system power. PV modules are created by connecting a number of PV solar cells and are then joined into panels with specific frames and connectors.

Typically, a PV solar cell includes a photoelectric conversion unit and a transparent conductive film. The transparent conductive film is disposed as a front electrode on the bottom of the PV solar cell in contact with a glass substrate and/or as a back surface electrode on the top of the PV solar cell. The photoelectric conversion unit includes a p-type silicon layer, a n-type silicon layer and an intrinsic type (i-type) silicon layer sandwiched between the p-type and n-type silicon layers. Typically, the silicon films of the photoelectric conversion unit are deposited by a plasma enhanced chemical vapor deposition (PECVD) process while the transparent conductive film may be deposited by a PECVD or a physical vapor deposition (PVD) process. As the photoelectric conversion unit and the transparent conductive film may be formed in different deposition equipment, the profile and dimension of each layer formed along the edge of the substrate may be different. For example, a PVD transparent conductive film deposition process can typically form the transparent conductive film throughout the substrate surface, and sometimes around the edge and onto a backside of the substrate. In contrast, in a CVD silicon deposition process, a shadow frame is typically utilized during deposition to cover substrate edge, thereby forming an electrical path to ground for preventing arcing and plasma leakage. However, use of the shadow frame during deposition may prevent silicon deposition along the edge of the substrate, thereby leaving edge of the substrate free from silicon films.

Accordingly, different deposition processes used for depositing the film stack on the substrate surface may often result in mismatched film profiles and film thickness at the edge of the substrate. As the film stack on the substrate periphery region are required to be removed or shaded out for the subsequent packaging or bonding process for a framing holding module, mismatched edge film profile and thickness often cause edge film removal process difficulty, thereby resulting in unwanted edge residual that may cause subsequent packaging and/or bonding process failure.

Therefore, there is a need for an improved method and apparatus for edge removal process on the substrate for fabricating photovoltaic devices.

SUMMARY OF THE INVENTION

The present invention provides a method and apparatus for removing film along an edge of a substrate. The method is particular advantageous for fabricating photovoltaic devices. In one embodiment, a method for manufacturing solar cell devices on a substrate includes providing a substrate into a chemical vapor deposition chamber, contacting a shadow frame disposed in the deposition chamber to a periphery region of the substrate, depositing a silicon-containing layer on the substrate through an aperture defined by the shadow frame, transferring the substrate to a physical vapor deposition chamber, depositing a transparent conductive layer on the silicon-containing layer in the physical vapor deposition chamber, transferring the substrate to a laser edge removal tool, and laser scribing the one or more layers formed on the periphery region of the substrate.

In another embodiment, a method for removing one or more layers on a periphery region of a substrate includes providing a substrate having a peripheral region and a cell integrated region, transferring the substrate into a chemical vapor deposition chamber, contacting a shadow frame disposed in the chemical vapor deposition chamber to the periphery region of the substrate, depositing a silicon-containing layer on the cell integrated region of the substrate exposed through by the shadow frame, transferring the substrate to a physical vapor deposition chamber, depositing a transparent conductive layer in the physical vapor deposition chamber, the transparent conductive layer deposited on the silicon-containing layer on both the periphery region and the cell integrated region of the substrate, transferring the substrate to a laser edge removal tool, and laser scribing the layers formed on the periphery region of the substrate.

In yet another embodiment, a method for removing layers on a periphery region of a substrate includes providing a substrate having a peripheral region and a cell integrated region, the substrate having a mismatched film thickness between the peripheral region and the cell integrated region of the substrate, and laser scribing at least one of the layers formed on the periphery region of the substrate, wherein the periphery region of the substrate has a width between about 8 mm and about 12 mm.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

FIG. 4A depicts a top view of a substrate having solar cell devices formed thereon in accordance with one embodiment of the present invention;

FIG. 4B depicts a cross sectional view of a substrate having solar cell devices formed thereon in accordance with one embodiment of the present invention;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods and apparatus for removing a portion of a film stack disposed on a periphery region of a substrate. The apparatus is a laser edge removal tool including a laser source that can remove and cut a portion of the film stack from the periphery region of the substrate. In one embodiment, the laser edge removal tool includes a laser source beam that can emit a beam having a desired wavelength that can be absorbed by selected materials disposed on the substrate targeted for removal from the substrate.

Figure 1:
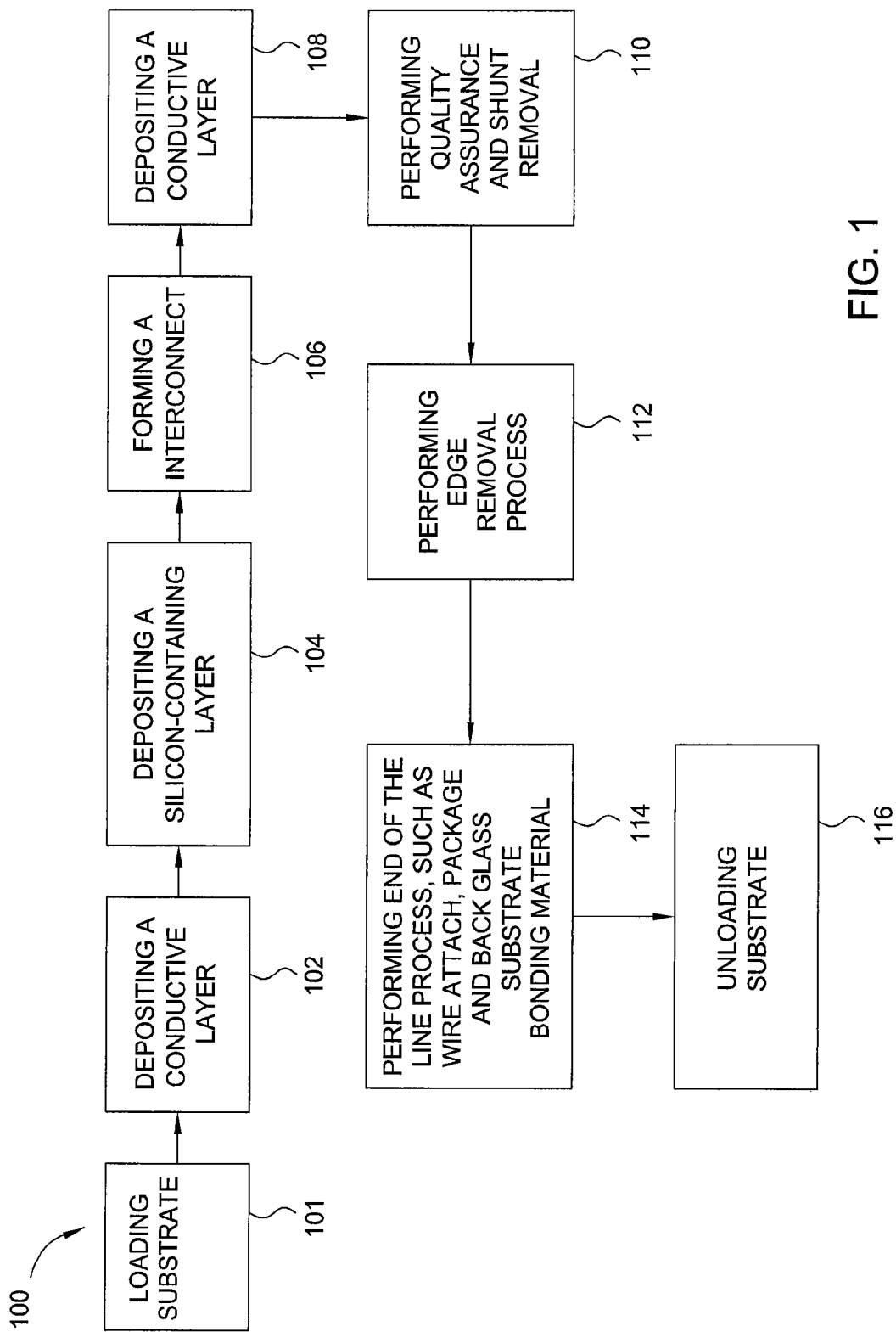
FIG. 1 depicts a partial flow diagram for manufacturing solar cell devices on a substrate.

FIG. 1 depicts a process sequence 100 for manufacturing solar cell devices on a substrate. The process sequence 100 may include a plurality of process steps performed in different processing modules and automation equipment for manufacturing the solar cell devices. It is noted that FIG. 1 only depicts a portion of the process steps performed during the manufacture of the solar cell devices. The configurations, number of processing steps, or order of the processing steps in the process sequence 100 is not intended to limit the scope of the invention described herein. Some other process steps of the process sequence are known to those skilled in the art and eliminated for sake of brevity. One suitable example of the overall process sequence is disclosed in detail by U.S. application Ser. No. 12/202,199, filed Aug. 29, 2008 by Bachrach et al, titled "Photovoltaic Production Line", and is herein incorporated by reference.

The process sequence 100 starts at step 101 by loading a substrate into a solar cell production line. The production line may include a plurality of processing tools and automation equipment to facilitate fabricating the solar cells on the substrate. At step 102, a first transparent conductive layer is deposited on the substrate in a conductive layer deposition chamber. Referring first to FIG. 4B, a first transparent conductive layer 414 is formed on the substrate 402 at step 102. The first conductive layer 414 may serve as a first electrode disposed on the substrate 402. One suitable exemplary chamber for the conductive layer deposition chamber will be discussed below with reference with FIG. 2.

At step 104, a silicon-containing film layer 416 is deposited over the first conductive layer 414, as shown in FIG. 4B. The silicon-containing film layer 416 may be a film stack typically includes a p-type silicon containing layer, a n-type silicon containing layer and an intrinsic type (i-type) silicon containing layer sandwiched between the p-type and n-type silicon containing layers. The silicon-containing film stack 416 may be deposited in a plasma enhanced chemical vapor deposition (PECVD) chamber, which will be discussed below with reference with FIG. 3. It is noted that multiple layers, more than three layers, may be formed in the silicon-containing film stack 416 for different process purposes. For example, multiple silicon based layers may be used in the silicon-containing film stack 416 to provide one or more, e.g., multiple, junctions to improve light conversion efficiency. One suitable example of the silicon-containing film stack is disclosed in detail by U.S. application Ser. No. 11/624,677, filed Jan. 18, 2007 by Choi et al, titled "Multi-Junctions Solar Cells and Methods and Apparatus for Forming the Same", U.S. application Ser. No. 12/208,478, filed Sep. 11, 2008 by Sheng et al, titled "Microcrystalline Silicon Alloys for Thin Film and Wafer Based Solar Applications", and are herein incorporated by references.

At step 106, an interconnect formation process is performed to form an interconnect, such as trenches, scribing lines, or patterns, on the substrate 402. As the exemplary embodiment depicted in FIG. 4B, the interconnection lines, such as the scribing lines 420A, 420B, 420C, may be formed on the substrate 402 by the interconnect formation process. The interconnect formation process is performed on the substrate to electrically isolate various regions of the substrate surface from each other by a laser ablation process. In one embodiment, a Nd:vanadate (Nd:YVO$_4$) laser source is used to ablate material from the substrate surface to form lines 420A, 420B, 420C that electrically isolate adjacent solar cells. Alternatively, a water jet cutting tool or diamond scribe may also be used to isolate the various regions on the substrate of the solar cell. It is noted that the interconnect formation process can be performed at other steps during the process sequence 100 to form different scribing lines on the substrate.

At step 108, a second transparent conductive layer 418 is deposited on the substrate 402 in a conductive layer deposition chamber, as depicted in FIG. 4B. The conductive layer deposition chamber used to deposit the second conductive layer 418 may be similar to the conductive layer deposition chamber utilized to deposit the first transparent conductive layer 414 described at step 102. The second conductive layer 418 may serve as a back electrode disposed on the substrate 402. One suitable exemplary chamber for the conductive layer deposition chamber will be discussed below with reference with FIG. 2.

At step 110, an optional quality assurance and/or shunt removal process may be performed on the substrate 402 to assure that the devices formed on the substrate surface meet a desired quality standard and in some cases correct defects in the formed devices. During the testing process, a probing device is used to measure the quality and material properties of the formed solar cell device by use of one or more substrate contacting probes. In one embodiment, the quality assurance testing tool projects a low level of light at the p-i-n junction(s) of the solar cell and uses the one more probes to measure the output of the cell to determine the electrical characteristics of the formed solar cell device(s). If the module detects a defect in the formed device, corrective action may be taken to fix the defects. In one embodiment, if a short or other similar defect is found, it may be desirable to create a reverse bias between regions on the substrate surface to control and/or correct one or more of the defectively formed regions of the solar cell device. During the correction process, the reverse bias generally delivers a high voltage sufficient to cause the defects in the solar cells to be corrected. In one example, if a short is found between supposedly isolated regions of the substrate, the magnitude of the reverse bias may be raised to a level that causes the conductive elements in areas between the isolated regions to change phase, decompose or become altered in a way that eliminates or reduces the magnitude of the electrical short.

At step 112, after the optional quality assurance and/or shunt removal process, the substrate 402 is transferred to a laser edge removal tool to remove a portion of film stack formed at the periphery region of the substrate 402. In one embodiment, the substrate 402 is positioned in the laser edge removal tool to remove a portion of the film stack along the edge of the substrate to reduce the likelihood of damage, such as clipping or particle generation, from occurring during the subsequent process. Additionally, removal of the edge portion of the film stack may also leave the periphery region of the substrate 402 free of materials which can be utilized later for a frame holding area to facilitate bonding or sealing the substrate 402 to a backside of another substrate to complete the solar cell module assembly.

In conventional techniques, a diamond impregnated belt, grit blasting or a grinding wheel is used to mechanically grind the deposited materials from periphery region of the substrate. However, conventional mechanical removal process often results in incomplete material removal on the substrate edge, scratch or even damage at the substrate edge. Accordingly, the laser edge removal tool facilitates an edge removal process that can efficiently remove materials from the substrate periphery region. One embodiment of a laser edge removal tool will be further discussed with reference to FIG. 5.

At step 114, end of the line process are performed on the substrate 402. The end of the line processes may include final wire attaching, bonding, packaging, and backside substrate bonding process. At step 116, after the support structure, wiring structures, or framing structures are formed on the substrate, the substrate 402 may be unloaded from the production line and the solar cell fabrication process is completed. It is noted that some other steps may be performed in between each steps to manufacture the devices. The process sequence 100 only provides an exemplary process sequence that includes only a portion of some major film deposition process steps to manufacture the devices. It is contemplated that other process sequences associated with the solar cell device fabrication may also be adapted to use the laser edge removal tool descried in the present invention.

Figure 2:
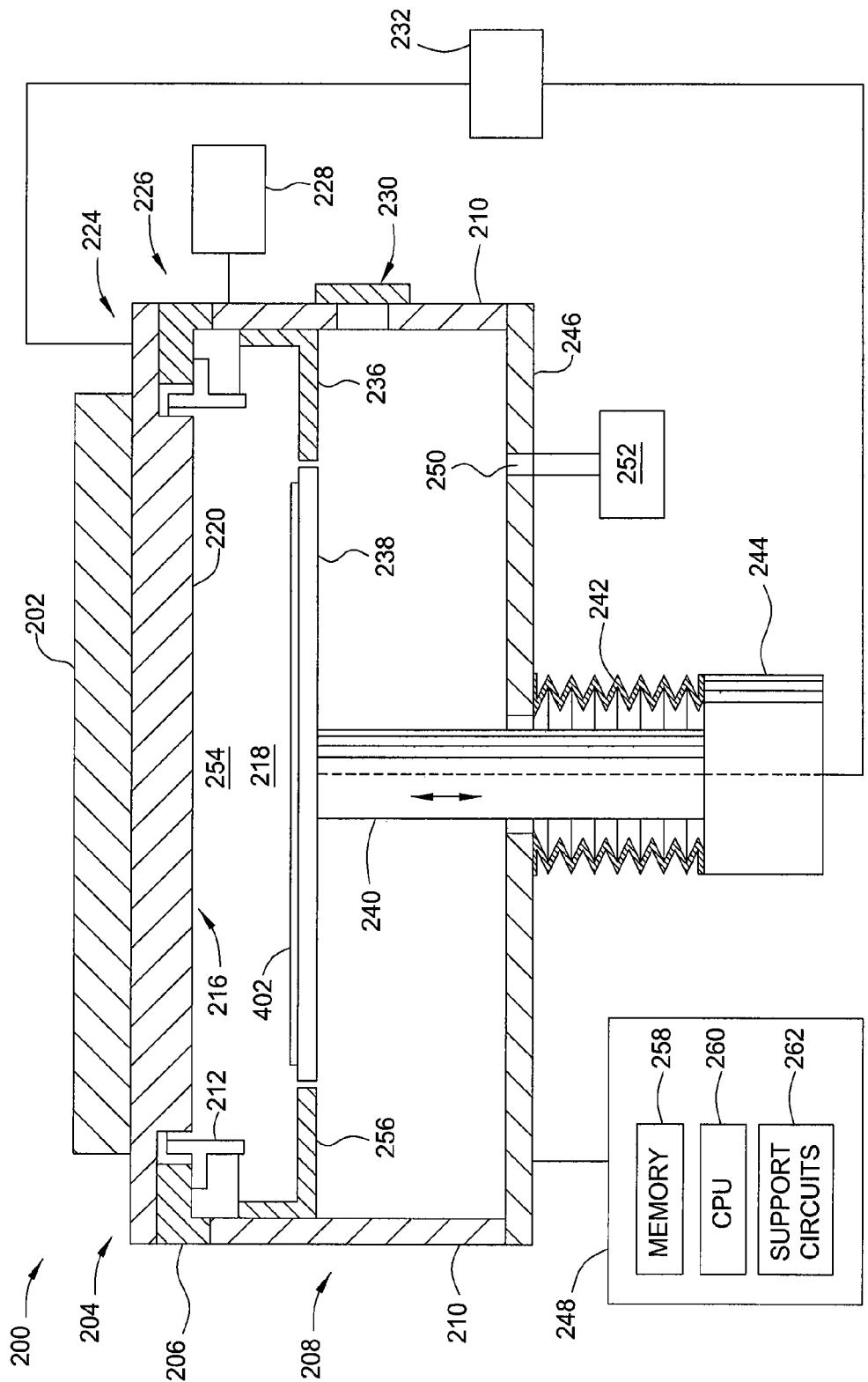
FIG. 2 depicts a schematic cross-sectional view of one embodiment of a plasma enhanced chemical vapor deposition (PECVD) process chamber.

FIG. 2 illustrates an exemplary reactive sputter process chamber 200 suitable for sputter depositing materials to form a transparent conductive layer, such as the first and the second transparent conductive layers 414, 418 on the substrate 402. One example of the process chamber that may be adapted to benefit from the invention is a PVD process chamber, available from Applied Materials, Inc., located in Santa Clara, Calif. It is contemplated that other sputter process chambers, including those from other manufactures, may be adapted to practice the present invention.

The process chamber 200 includes a chamber body 208 having a processing volume 218 defined therein. The chamber body 208 has sidewalls 210 and a bottom 246. The dimensions of the chamber body 208 and related components of the process chamber 200 are not limited and generally are proportionally larger than the size of the substrate 402 to be processed. Any substrate size may be processed in a suitably configured chamber. Examples of suitable substrate sizes include substrate having a surface area of about 2,000 centimeter square or more, such as about 4,000 centimeter square or more, for example about 10,000 centimeter square or more. In one embodiment, a substrate having a surface area of about 50,000 centimeter square or more or more may be processed.

A chamber lid assembly 204 is mounted on the top of the chamber body 208. The chamber body 208 may be fabricated from aluminum or other suitable material. A substrate access port 230 is formed through the sidewall 210 of the chamber body 208, facilitating the transfer of the substrate 402 (i.e., a solar panel, a flat panel display substrate, a semiconductor wafer, or other workpiece) into and out of the process chamber 200. The access port 230 may be coupled to a transfer chamber and/or other chambers of a substrate processing system.

A gas source 228 is coupled to the chamber body 208 to supply process gases into the processing volume 218. In one embodiment, process gases may include inert gases, non-reactive gases, and reactive gases. Examples of process gases that may be provided by the gas source 228 include, but not limited to, argon gas (Ar), helium (He), nitrogen gas ($N_2$), oxygen gas ($O_2$), $H_2$, $NO_2$, $N_2O$ and $H_2O$ among others.

A pumping port 250 is formed through the bottom 246 of the chamber body 208. A pumping device 252 is coupled to the process volume 218 to evacuate and control the pressure therein. In one embodiment, the pressure level of the process chamber 200 may be maintained at about 1 Torr or less. In another embodiment, the pressure level of the process chamber 200 may be maintained at about $10^{-3}$ Torr or less. In yet another embodiment, the pressure level of the process chamber 200 may be maintained at about $10^{-5}$ Torr to about $10^{-7}$ Torr. In another embodiment, the pressure level of the process chamber 200 may be maintained at about $10^{-7}$ Torr or less.

The lid assembly 204 generally includes a target 220 and a ground shield assembly 226 coupled thereto. The target 220 provides a material source that can be sputtered and deposited onto the surface of the substrate 402 during a PVD process. The target 220 or target plate may be fabricated from a material utilized to provide deposition species. A high voltage power supply, such as a power source 232, is connected to the target 220 to facilitate sputtering materials from the target 220. In one embodiment, the target 220 may be fabricated from a material containing zinc (Zn) metal. In another embodiment, the target 220 may be fabricated from materials including metallic zinc (Zn) containing target, zinc alloy, zinc and aluminum alloy and the like. In yet another embodiment, the target 220 may be fabricated from materials including a zinc containing material and an aluminum containing material. In one embodiment, the target may be fabricated from a zinc oxide and aluminum oxide material.

In one embodiment, the target 220 is fabricated from a zinc and aluminum alloy having a desired ratio of zinc element to aluminum element fabricated in the target 220. The aluminum elements formed in the target 220 assists maintaining the target conductivity at a certain range so as to efficiently enable a uniform sputter process across the target surface. The aluminum elements in the target 220 are also believed to increase film transmittance when sputtered off and deposited onto the substrate. In one embodiment, the concentration of the aluminum elements present in the zinc target 220 are controlled at less than about 5 percent by weight. In the embodiment wherein the target 220 is fabricated from ZnO and $Al_2O_3$ alloy, the $Al_2O_3$ dopant concentration in the ZnO target is controlled at less than about 3 percent by weight, for example about less than 2 percent by weight, such as about less than 0.5 percent by weight, for example, about 0.25 percent by weight.

The target 220 generally includes a peripheral portion 224 and a central portion 216. The peripheral portion 224 is disposed over the sidewalls 210 of the chamber 200. The central portion 216 of the target 220 may have a curvature surface slightly extending towards the surface of the substrate 402 disposed on a substrate support 238. The spacing between the target 220 and the substrate support 238 is maintained between about 50 mm and about 150 mm during processing. It is noted that the dimension, shape, materials, configuration and diameter of the target 220 may be varied for specific process or substrate requirements. In one embodiment, the target 220 may further include a backing plate having a central portion bonded and/or fabricated from a material desired to be sputtered onto the substrate surface. The target 220 may also include adjacent tiles or material segments that together form the target.

Optionally, the lid assembly 204 may further comprise a magnetron assembly 202 mounted above the target 220 which enhances efficient sputtering materials from the target 220 during processing. Examples of the magnetron assembly 202 include a linear magnetron, a serpentine magnetron, a spiral magnetron, a double-digitated magnetron, a rectangularized spiral magnetron, among others.

The ground shield assembly 226 of the lid assembly 204 includes a ground frame 206 and a ground shield 212. The ground shield assembly 226 may also include a chamber shield member, a target shield member, a dark space shield and a dark space shield frame. The ground shield 212 is coupled to the peripheral portion 224 by the ground frame 206 defining an upper processing region 254 below the central portion of the target 220 in the process volume 218. The ground frame 206 electrically insulates the ground shield 212 from the target 220 while providing a ground path to the chamber body 208 of the process chamber 200 through the sidewalls 210. The ground shield 212 constrains plasma generated during processing within the upper processing region 254 and dislodges target source material from the confined central portion 216 of the target 220, thereby allowing the dislodged target source to be mainly deposited on the substrate surface rather than chamber sidewalls 210. In one embodiment, the ground shield 212 may be formed by one or more work-piece fragments and/or a number of these pieces bonding by a substrate process, such as welding, gluing, high pressure compression, etc.

A shaft 240 extending through the bottom 246 of the chamber body 208 couples to a lift mechanism 244. The lift mechanism 244 is configured to move the substrate support 238 between a lower transfer position and an upper processing position. A bellows 242 circumscribes the shaft 240 and coupled to the substrate support 238 to provide a flexible seal therebetween, thereby maintaining vacuum integrity of the chamber processing volume 218.

A chamber shield 236 may be disposed on the inner wall of the chamber body 208. The chamber shield 236 has a lip 256 extending inward toward the substrate support 238. Lift pins (not shown) are selectively moved through the substrate support 238 to lift the substrate 402 above the substrate support 238 to facilitate access to the substrate 402 by a transfer robot or other suitable transfer mechanism.

A controller 248 is coupled to the process chamber 200. The controller 248 includes a central processing unit (CPU) 260, a memory 258, and support circuits 262. The controller 248 is utilized to control the process sequence, regulating the gas flows from the gas source 228 into the chamber 200 and controlling ion bombardment of the target 220. The CPU 260 may be of any form of a general purpose computer processor that can be used in an industrial setting. The software routines can be stored in the memory 258, such as random access memory, read only memory, floppy or hard disk drive, or other form of digital storage. The support circuits 262 are conventionally coupled to the CPU 260 and may comprise cache, clock circuits, input/output subsystems, power supplies, and the like. The software routines, when executed by the CPU 260, transform the CPU into a specific purpose computer (controller) 248 that controls the process chamber 200 such that the processes are performed in accordance with the present invention. The software routines may also be stored and/or executed by a second controller (not shown) that is located remotely from the chamber 200.

During processing, material is sputtered from the target 220 and deposited on the surface of the substrate 402. The target 220 and the substrate support 238 are biased relative to each other by the power source 232 to maintain a plasma formed from the process gases supplied by the gas source 228. The ions from the plasma are accelerated toward and strike the target 220, causing target material to be dislodged from the target 220. The dislodged target material and process gases forms a layer on the substrate 402 with a desired composition. As a conventional shadow frame is not utilized in this chamber 200, the sputtered materials from the target 220 is deposited across the substrate surface, or even slightly extended to an periphery region portion of the substrate backside. As depicted in the exemplary embodiment depicted in FIG. 4B, the first transparent conductive layer 414 and the second transparent conductive layer 418 deposited by the PVD chamber 200 of FIG. 2 are deposited in a periphery region 410 of the substrate 402.

Figure 3:
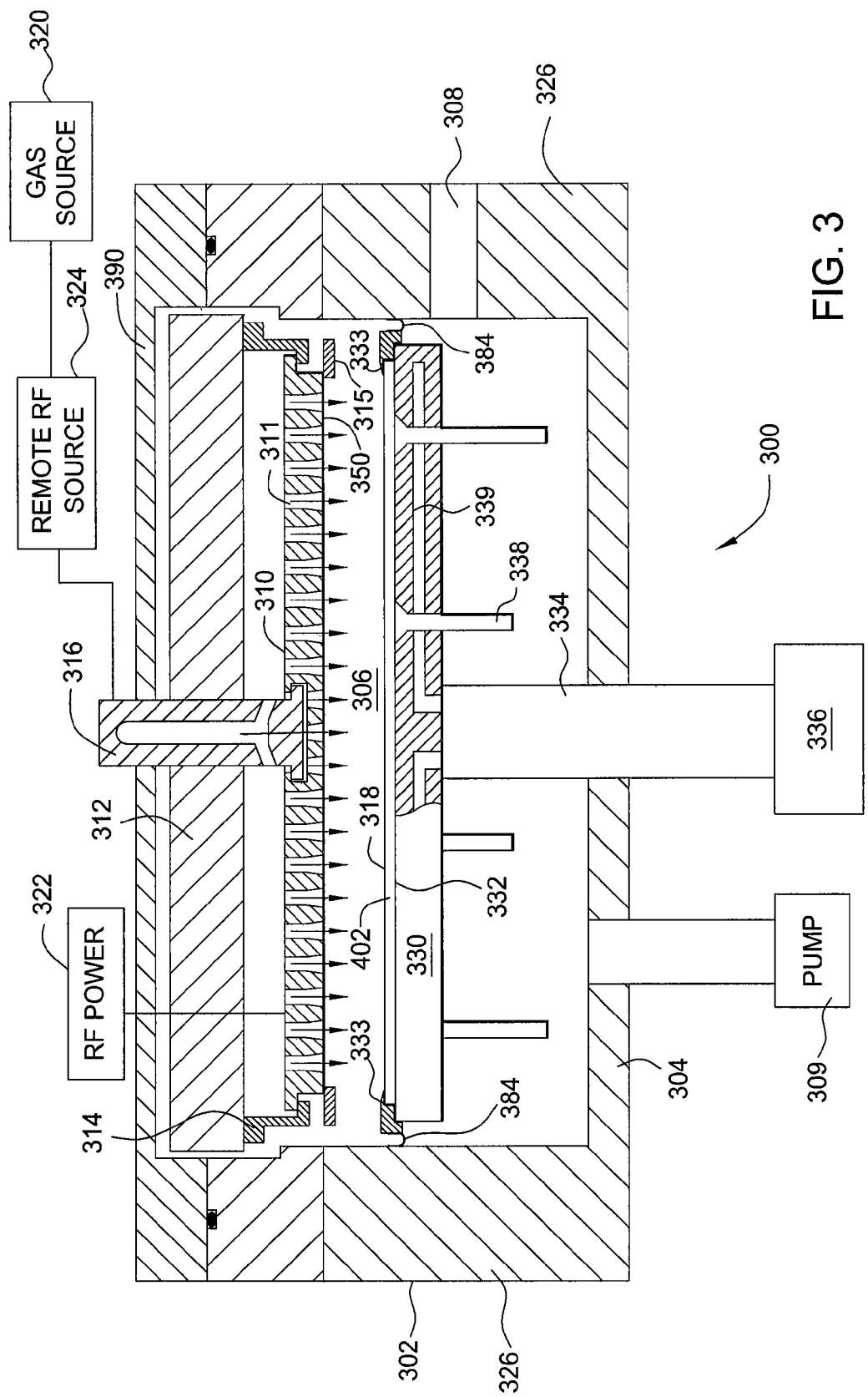
FIG. 3 depicts a schematic cross-sectional view of one embodiment of a physical vapor deposition (PVD) process chamber.

FIG. 3 is a cross sectional view of one embodiment of a plasma enhanced chemical vapor deposition chamber 300 that may be utilized to deposit the silicon-containing film stack 416, as shown in FIG. 4B. One example of the process chamber that may be adapted to benefit from the invention is a CVD process chamber, available from Applied Materials, Inc., located in Santa Clara, Calif. It is contemplated that other sputter process chambers, including those from other manufactures, may be adapted to practice the present invention.

The chamber 300 generally includes sidewalls 326 and a bottom 304 which bound a process volume 306. The sidewalls 326 and bottom 304 of the chamber body 302 are typically fabricated from a unitary block of aluminum or other material compatible with process chemistries. A lid assembly 390 encloses the process volume 306. A gas distribution plate 310 and substrate support assembly 330 are disposed in the process volume 306. A RF source 322 is coupled to an electrode at the top of the chamber, such as a backing plate 312 and/or gas distribution plate 310, to provide a RF power to create an electric field between the gas distribution plate 310 and the substrate support assembly 330. The electric field generates a plasma from the gases between the gas distribution plate 310 and the substrate support assembly 330 which are utilized to process the substrate 402 disposed on the substrate support assembly 330. The process volume 306 is accessed through a valve 308 formed through the sidewall 326 such that a substrate 402 may be transferred into and out of the chamber 300. A vacuum pump 309 is coupled to the chamber 300 to maintain the process volume 306 at a desired pressure.

The substrate support assembly 330 includes a substrate receiving surface 332 and a stem 334. The substrate receiving surface 332 supports the substrate 402 while processing. The stem 334 is coupled to a lift system 336 which raises and lowers the substrate support assembly 330 between a lower substrate transfer position and a raised processing position. The nominal spacing during deposition between the top surface of a substrate disposed on the substrate receiving surface 332 and the gas distribution plate 310 may generally vary between 200 mil and about 1,400 mil, such as between 400 mil and about 800 mil, or other distance to provide desired deposition results.

A shadow frame 333 is placed over the periphery region of the substrate 402 when processing to prevent deposition on the edge of the substrate 402. The shadow frame 333 confines the deposition of the silicon layers to certain regions of the substrate 402. In one embodiment, the shadow frame 333 covers the periphery region 410 of the substrate 402, as shown in FIG. 4A, defining a center aperture allowing a cell integrated portion 412 of the substrate 402 to be exposed for deposition. Accordingly, only the exposed portion 412 of the substrate 402 will have silicon materials deposited thereon. The periphery region 410 of the substrate 402 will remain substantially free of silicon containing material deposition. In the exemplary embodiment depicted in FIG. 4B, after the first transparent conductive layer 414 deposited on the substrate 402, the silicon-containing film stack 416 is formed on the substrate 402. AN edge of the stack 416 is spaced a distance 408 away from the substrate edge, leaving the periphery region 410 around each side of the substrate free of the silicon-containing film stack 416. After the silicon-containing film stack 416 is formed on the substrate 402, the second transparent conductive layer 418 is subsequently deposited over the silicon-containing film stack 416 across the substrate, covering the periphery region 410 with the second transparent conductive layer 418.

Referring back to FIG. 3, lift pins 338 are moveably disposed through the substrate support assembly 330 and adapted to space the substrate 402 from the substrate receiving surface 332. The substrate support assembly 330 may also include heating and/or cooling elements 339 utilized to maintain the substrate support assembly 330 at a desired temperature. In one embodiment, the heating and/or cooling elements 339 may be set to provide a substrate support assembly temperature during deposition of about 400 degrees Celsius or less, for example between about 100 degrees Celsius and about 400 degrees Celsius, or between about 150 degrees Celsius and about 300 degrees Celsius, such as about 200 degrees Celsius. In one embodiment, the substrate support assembly 330 has a polygonal plan area, for example, bounded by four lateral sides.

In one embodiment, a plurality of RF return paths 384 are coupled to the substrate support assembly 330 to provide RF return from the periphery of the substrate support assembly 330. The substrate support assembly 330 may be coupled to the RF return paths 384 during processing to allow the RF current travel back to the RF source. The RF return path 384 provides a low-impedance portion of the RF return path between the substrate support assembly 330 and the RF power source 322, such as via a cable directly or through the chamber ground chassis.

In one embodiment, the RF return paths 384 are a plurality of flexible straps (two of which are shown in FIG. 3) coupled between the perimeter of the substrate support assembly 330 and the chamber sidewall 326. The RF return path 384 may be fabricated from titanium, aluminum, stainless steel, beryllium copper, a material coated with a conductive metallic coating, or other suitable RF conducting material. The RF return path 384 may be evenly or randomly distributed along the respective sides of the substrate support assembly 330.

In one embodiment, the RF return path 384 has a first end coupled to substrate support assembly 330 and a second end coupled to the chamber sidewall 326. The RF return path 384 may be coupled to the substrate support assembly 330 directly, through the shadow frame 333 and/or through other suitable RF conductors.

The gas distribution plate 310 is coupled to a backing plate 312 at its periphery by a suspension 314. A lid assembly 390 is supported by the sidewalls 326 of the processing chamber 300 and may be removed to service the interior of the chamber body 302. The lid assembly 390 is generally comprised of aluminum. The gas distribution plate 310 is coupled to the backing plate 312 by one or more center supports 316 to help prevent sag and/or control the straightness/curvature of the gas distribution plate 310. In one embodiment, the gas distribution plate 310 may have different configurations with different dimensions. In an exemplary embodiment, the gas distribution plate 310 is a quadrilateral gas distribution plate. The gas distribution plate 310 has a downstream surface 350 having a plurality of apertures 311 formed therethrough facing an upper surface 318 of the substrate 402 disposed on the substrate support assembly 330. In one embodiment, the apertures 311 may have different shapes, numbers, densities, dimensions, and distributions across the gas distribution plate 310. The diameter of the apertures 311 may be selected between about 0.01 inch and about 1 inch. A gas source 320 is coupled to the backing plate 312 to provide gas through the backing plate 312, and then through the apertures 311 of the gas distribution plate 310 to the process volume 306.

The RF power source 322 is coupled to the backing plate 312 and/or to the gas distribution plate 310 to provide a RF power to create an electric field between the gas distribution plate 310 and the substrate support assembly 330 so that a plasma may be generated from the gases between the gas distribution plate 310 and the substrate support assembly 330. Various RF frequencies may be used, such as a frequency between about 0.3 MHz and about 200 MHz. In one embodiment the RF power source is provided at a frequency of 13.56 MHz. Examples of gas distribution plates are disclosed in U.S. Pat. No. 6,477,980 issued on Nov. 12, 2002 to White, et al., U.S. Publication No. 20050251990 published on Nov. 17, 2005 to Choi, et al., and U.S. Publication No. 2006/0060138 published on Mar. 23, 2006 to Keller, et al, which are all incorporated by reference in their entirety.

A remote plasma source 324, such as an inductively coupled remote plasma source, may also be coupled between the gas source 320 and the backing plate 312. Between processing substrates, a cleaning gas may be energized in the remote plasma source 324 to remotely provide plasma utilized to clean chamber components. The cleaning gas may be further excited by the RF power provided to the gas distribution plate 310 by the RF power source 322. Suitable cleaning gases include, but are not limited to, $NF_3$, $F_2$, and $SF_6$. Examples of remote plasma sources are disclosed in U.S. Pat. No. 5,788,778 issued Aug. 4, 1998 to Shang et al, which is incorporated by reference.

FIG. 4A depicts a top view of the substrate 402 after processing in the PVD chamber 200 of FIG. 2 at step 102, 108 and CVD chamber 300 of FIG. 3 at step 104 prior to the substrate edge removal process at step 112. As discussed above, after layers of deposition, the periphery region 410 of the substrate 402 may have a different film stack thickness than the thickness of the film stack in the cell integrated region 412. In one embodiment, the periphery region 410 has the distance 408 between about 8 mm and about 12 mm, such as about 10 mm, from the substrate edge.

FIG. 4B further depicts a cross sectional view of solar cell devices 450 illustrating various scribed regions used to form individual cells within the solar cell 450 in the cell integrated region 412 of the substrate 402. As discussed above, the solar cell device 450 includes the substrate 402, the first transparent conductive layer 414, the silicon-containing film stack 416 (e.g., at least one p-i-n junction), and the second transparent conductive layer 418. The interconnect formation process (such as the process step described at step 106) may be performed for three times to laser scribe the substrate 402 to produce isolation grooves (e.g., scribing lines) 420A, 420B, 420C, which are generally required to form a high efficiency solar cell device. Although formed together on the substrate 402, the isolation grooves 420A and 420B are isolated from each other by the isolation groove 420C formed in the second transparent conductive layer 418 and the silicon-containing film stack 416. In addition, the isolation groove 420B is formed in the silicon-containing film stack 416 so that the second transparent conductive layer 418 is in electrical contact with the first transparent conductive layer 414. In one embodiment, the isolation groove 420A is formed by the laser scribe removal of a portion of the first transparent conductive layer 414 prior to the deposition of the silicon-containing film stack 416 and the second transparent conductive layer 418. Similarly, in one embodiment, the isolation groove 420B is formed in the silicon-containing film stack 416 by the laser scribe removal of a portion of the silicon-containing film stack 416 prior to the deposition of the second transparent conductive layer 418. The silicon-containing film stack 416 may be configured to be a single junction cell or multiple junction cells.

In one embodiment, the first and the second transparent conductive layer 414, 418 are zinc containing material, aluminum containing material, tin containing material, ITO containing material, alloys thereof, and any other suitable conductive materials. The silicon-containing film stack 416 includes at least a p-type silicon layer, a n-type silicon layer and an intrinsic type (i-type) silicon layer sandwiched between the p-type and n-type silicon layers. The silicon layers may be microcrystalline silicon based material, amorphous silicon based materials, or polysilicon based material. In one exemplary embodiment, the silicon-containing film stack 416 includes a single solar cell junction having a p-type amorphous silicon layer, a i-type amorphous silicon layer, and a n-type amorphous silicon layer. In yet another exemplary embodiment, the silicon silicon-containing film stack 416 includes a tandem junction having a top cell including a p-type amorphous silicon layer, a i-type amorphous silicon layer, and a n-type microcrystalline silicon layer, and a bottom cell including a p-type microcrystalline silicon layer, a i-type microcrystalline silicon layer and a n-type amorphous silicon layer.

As discussed above, when forming different layers on the substrate utilizing different tools, a mismatch in the film thickness may result at the periphery region 410 of the substrate 402. As the use of the shadow frame during the silicon-containing film stack deposition process may cause the substrate periphery region 410 to be free of the silicon-containing film stack, the film thickness at the periphery region 410 typically includes only the thickness of the first 414 and the second transparent conductive layer 418. In order to remove the residual films formed in the periphery region 410 of the substrate 402, the substrate 402 is further transferred to the laser edge removal tool 500 as discussed below with reference to FIG. 5 to remove one or more of the films in the periphery region 410.

Figure 5:
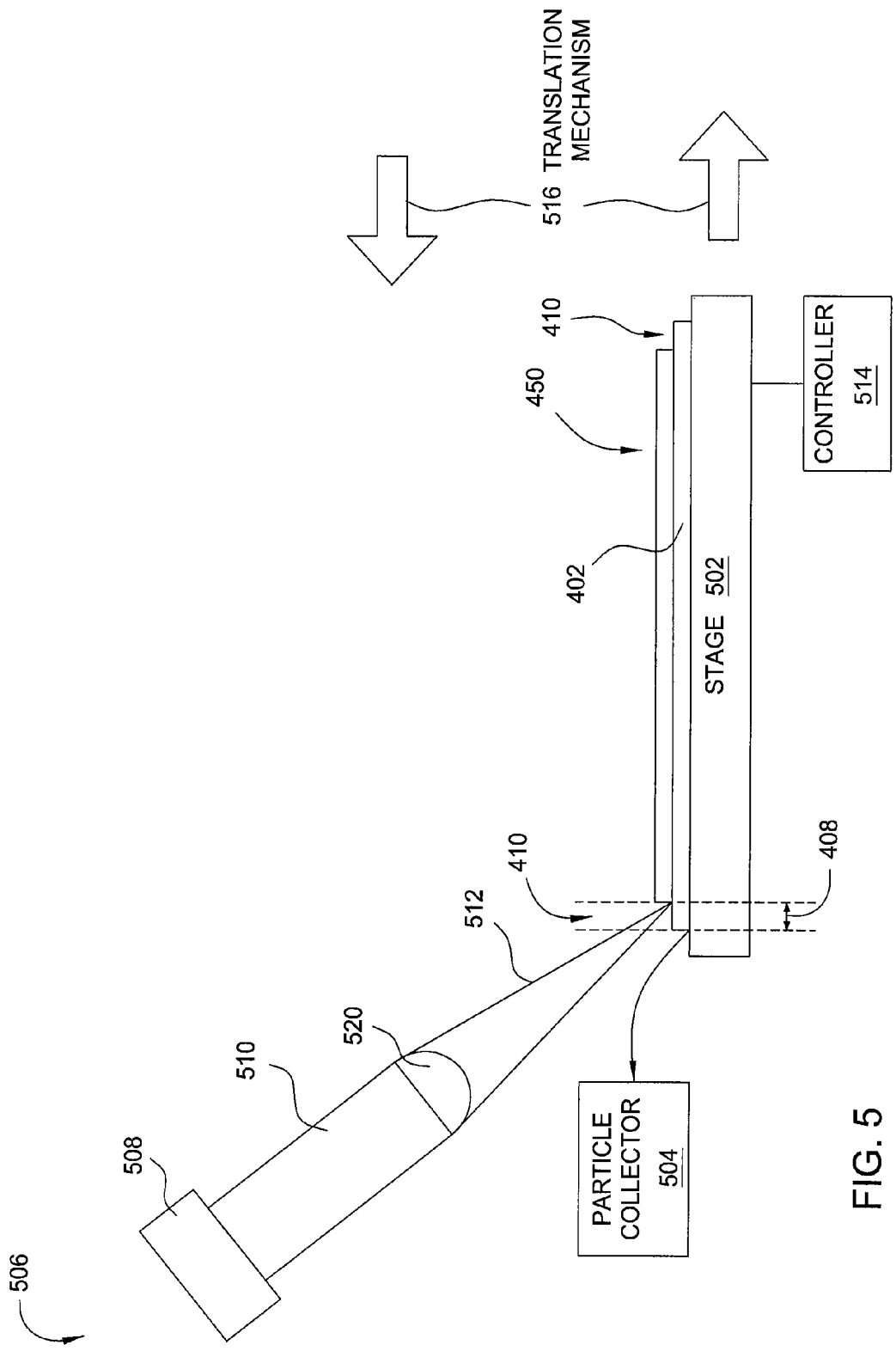
FIG. 5 depicts a diagram of a side view of one embodiment of a laser edge removal apparatus that may be utilized to practice the present invention.

FIG. 5 depicts the laser edge removal tool 500 that may be used to remove one or more of films from the periphery region of the substrate 402, as described above at step 112. The laser edge removal tool 500 comprises a wave electromagnetic radiation module 506, a stage 502 configured to receive the substrate 402 disposed thereon, and a translation mechanism 516. The wave electromagnetic radiation module 506 comprises a wave electromagnetic radiation source 508 and focusing optics 510 disposed between the wave electromagnetic radiation source 508 and the stage 502.

In one embodiment, the wave electromagnetic radiation source 508 may be a light source made from Nd:YAG, Nd:YVO$_4$, crystalline disk, fiber-Diode and other sources that can provide and emit a continuous wave of radiation at a wavelength between about 1030 nm and about 1070 nm, such as about 1064 nm. In another embodiment, the wave electromagnetic radiation source 508 may include multiple laser diodes, each of which produces uniform and spatially coherent light at the same wavelength. In yet another embodiment, the power of the laser diode/s is in the range of about 100 Watts to 1000 Watts.

The focusing optics 510 may include one or more collimators to collimate radiation from the wave electromagnetic radiation source 508 into a substantially parallel beam. This collimated radiation beam is then focused by at least one lens 520 into a line of radiation 512 directed at the periphery region 410 of the substrate 402. The radiation 512 is controlled to focus on the periphery region along each side of the substrate 402 to remove the film stack form the periphery region. The radiation 512 may scan around each side of the substrate 402 as many times as needed until the film stack has been completely removed.

Lens 520 may be any suitable lens, or series of lenses, capable of focusing radiation into a line or spot. In one embodiment, lens 520 is a cylindrical lens. Alternatively, lens 520 may be one or more concave lenses, convex lenses, plane mirrors, concave mirrors, convex mirrors, refractive lenses, diffractive lenses, Fresnel lenses, gradient index lenses, or the like.

A particle collector 504 may be disposed adjacent to the periphery region 410 of the substrate. When laser cutting, the evaporated laser removed film may be drawn to the particle collector 504 to remain cleanness of the tool 500. The stage 502 is any platform or chuck capable of securely holding the substrate 402 during transmission, as explained below. In one embodiment, the stage 502 includes a means for grasping the substrate, such as a frictional, vacuum, gravitational, mechanical, or electrical system. Examples of suitable means for grasping include, mechanical clamps, electrostatic or vacuum chucks, or the like.

The laser edge removal tool 500 may include a translation mechanism 516 configured to translate the stage 502 and the line of radiation 512 relative to one another. In one embodiment, the translation mechanism 516 is coupled to the stage 502 to move the stage 502 relative to the wave electromagnetic radiation source 508 and/or the focusing optics 510. In another embodiment, the translation mechanism 516 is coupled to the wave electromagnetic radiation source 508 and/or the focusing optics 510 to move the wave electromagnetic radiation source 508 and/or the focusing optics 510 relative to the stage 502. In yet another embodiment, the translation mechanism 516 moves both the wave electromagnetic radiation source 508 and/or the focusing optics 510, and the stage 502. Any suitable translation mechanism may be used, such as a conveyor system, rack and pinion system, or an x/y actuator, a robot, or other suitable mechanism.

The translation mechanism 516 may be coupled to a controller 514 to control the scan speed at which the stage 502 and the line of radiation 512 move relative to one another. In addition, translation of the stage 502 and the line of radiation 512 relative to one another may be configured to be along the periphery region 410 of the substrate 402 to focus on removing the films on the substrate edge without damage other regions of the substrate 402. In one embodiment, the translation mechanism 516 moves at a constant speed, of approximately 1000 centimeters per seconds (cm/s) for a 10 mm to 20 mm wide line, for example, similar to the distance 408 from the periphery region 410 of the substrate 402. In another embodiment, the translation of the stage 502 and the line of radiation 512 relative to one another may be moved with other paths as desired.

After the laser removal process, the film stack at the periphery region 410 of the substrate 402 may be removed. A portion of the substrate 402 deposited below the first 414 and the second transparent conductive layer 418 may be also removed to ensure the cleanliness of the substrate periphery region to facilitate the subsequent frame bonding process.

Figure 6:
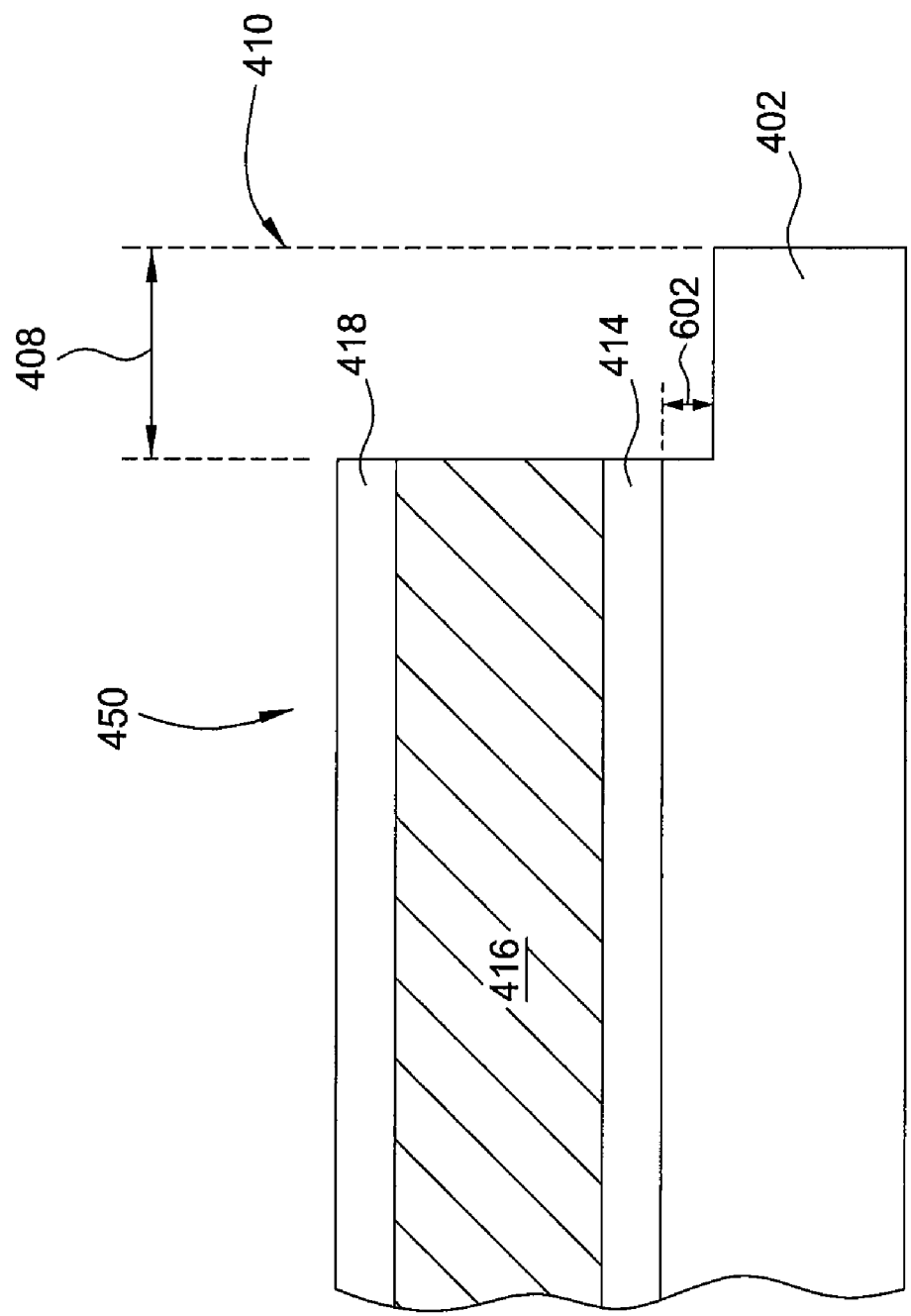
FIG. 6 depicts a cross sectional view of a substrate which an edge removal process has been performed on a periphery region of the substrate.

FIG. 6 depicts a cross sectional view of the substrate 402 after the edge removal process is performed. After laser edge removal process, the films previously located at the periphery region 410 of the substrate 402 are removed. Optionally, a portion of the substrate 402 may also be removed. In one embodiment, a portion of the substrate 402 having a depth 602 between about 20 μm and about 40 μm from the substrate surface is also removed.

Thus, improved methods and apparatus for removing a portion of a film stack disposed at a substrate edge are provided. The method and apparatus advantageously increase accuracy of removing film stack at a periphery region of the substrate, thereby providing a good seal surface for the substrate to facilitating bonding and packaging processes.

While the foregoing is directed to embodiments of the present invention, other and further embodiments of the invention may be devised without departing from the basic scope thereof, and the scope thereof is determined by the claims that follow.

What is claimed is:

1. A method for manufacturing solar cell devices on a substrate, comprising:
   disposing a shadow frame positioned in a chemical vapor deposition chamber over a periphery region of a substrate;
   depositing a silicon-containing layer on the substrate through an aperture defined by the shadow frame;
   transferring the substrate to a physical vapor deposition chamber;
   depositing a transparent conductive layer on the silicon-containing layer and at least a portion of the periphery region of the substrate in the physical vapor deposition chamber;
   transferring the substrate to a laser edge removal tool; and
   removing the transparent conductive layer formed on the periphery region of the substrate using a laser disposed in the laser edge removal tool.

2. The method of claim 1, wherein removing the transparent conductive layer further comprises:
   removing a portion of the silicon-containing layer disposed adjacent to the periphery region of the substrate.

3. The method of claim 1, wherein the periphery region has a width about 8 mm and about 12 mm measured from an edge of the substrate.

4. The method of claim 1, wherein depositing the silicon-containing layer further comprises:
   forming a p-type silicon containing layer;
   forming an i-type silicon containing layer on the p-type silicon containing layer; and
   forming a n-type silicon containing layer on the i-type silicon containing layer.

5. The method of claim 1, wherein the substrate has a conductive layer deposited thereon prior to depositing the silicon-containing layer.

6. The method of claim 1, wherein removing the transparent conductive layer further comprises:
   removing a portion of the substrate.

7. The method of claim 6, wherein between about 20 μm and about 40 μm is removed from the substrate upper surface.

8. The method of claim 1, wherein removing the transparent conductive layer further comprises:
   continuously scanning a laser along the periphery region on each side of the substrate.

9. The method of claim 5, wherein the transparent conductive layer is at least one of a zinc containing material, an aluminum containing material, a tin containing material, an ITO containing material or alloys thereof.

10. The method of claim 1, further comprising:
    depositing a metal layer over the periphery region of the substrate prior to transferring the substrate to the laser edge removal tool.

11. A method for removing one or more layers from a periphery region of a substrate, comprising:
    disposing a shadow frame positioned in a chemical vapor deposition chamber over a periphery region of a substrate, wherein the substrate has the peripheral region and a cell integrated region;
    depositing a silicon-containing layer on the cell integrated region of the substrate exposed through an aperture formed in the shadow frame;
    transferring the substrate to a physical vapor deposition chamber;
    depositing a transparent conductive layer over the peripheral region and the cell integrated region of the substrate using a physical vapor deposition chamber;
    transferring the substrate to a laser edge removal tool; and
    removing the layers formed on the periphery region of the substrate using a laser.

12. The method of claim 11, wherein the peripheral region of the substrate has a width between about 8 mm and about 12 mm.

13. The method of claim 11, wherein removing the layers further comprises:
    removing deposited layers on the peripheral region of the substrate.

14. The method of claim 11, wherein removing the layers further comprises:
    removing a portion of the substrate.

15. The method of claim 14, wherein the portion of the substrate forms a trench having a depth between about 20 μm and about 40 μm of the substrate.

16. The method of claim 11, wherein depositing the silicon-containing layer further comprises:
    forming a first p-i-n junction on the substrate; and
    forming a second p-i-n junction over the first p-i-n junction.

17. The method of claim 16, wherein forming the first p-i-n junction comprises:
    forming a p-type amorphous silicon layer;
    forming an i-type amorphous silicon layer on the p-type amorphous silicon layer; and
    forming a n-type microcrystalline silicon layer on the i-type amorphous silicon layer.

18. The method of claim 16, wherein the forming the second p-i-n junction comprises:
- forming a p-type microcrystalline silicon layer;
- forming an i-type microcrystalline silicon layer on the p-type microcrystalline silicon layer; and
- forming a n-type amorphous silicon layer on the i-type microcrystalline silicon layer.

19. A method for removing layers on a peripheral region of a substrate, comprising:
- providing a substrate having a peripheral region and a cell integrated region, wherein the peripheral region has a second transparent conductive layer formed on a first transparent conductive layer and the cell integrated region has the second transparent conductive layer formed on a silicon containing film layer disposed on the first transparent conductive layer; and
- removing at least one of the layers formed on the peripheral region of the substrate using a laser, wherein the peripheral region of the substrate has a width between about 8 mm and about 12 mm.

* * * * *